United States Patent
Zhou

(10) Patent No.: US 10,636,672 B2
(45) Date of Patent: Apr. 28, 2020

(54) METHOD FOR FLUOROCARBON FILM USED AS MIDDLE STOP LAYER FOR POROUS LOW K FILM

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Ming Zhou, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/664,966

(22) Filed: Jul. 31, 2017

(65) Prior Publication Data

US 2018/0096857 A1 Apr. 5, 2018

(30) Foreign Application Priority Data

Sep. 30, 2016 (CN) .......................... 2016 1 0868147

(51) Int. Cl.
*H01L 21/311* (2006.01)
*H01L 21/768* (2006.01)
(Continued)

(52) U.S. Cl.
CPC .. *H01L 21/31122* (2013.01); *H01L 21/31116* (2013.01); *H01L 21/31138* (2013.01);
(Continued)

(58) Field of Classification Search
CPC ............. H01L 21/311; H01L 21/31116; H01L 21/3118; H01L 21/31144; H01L 21/76802;
(Continued)

(56) References Cited

U.S. PATENT DOCUMENTS 5,674,355 A 10/1997 Cohen et al.
6,291,334 B1 9/2001 Somekh
(Continued)

FOREIGN PATENT DOCUMENTS

WO 03081645 10/2003

OTHER PUBLICATIONS

Ding et al., Spectral Characterization of Amorphous Fluorinated Carbon Film with a Low Dielectric Constant, Spectroscopy and Spectral Analysis, vol. 21, No. 6, http://www.cnki.net, Dec. 2001, pp. 745-748.
(Continued)

*Primary Examiner* — Phat X Cao
(74) *Attorney, Agent, or Firm* — Kilpatrick Townsend & Stockton LLP

(57) ABSTRACT

A method for manufacturing an interconnect structure includes providing a metal interconnect layer, forming a first dielectric layer on the metal interconnect layer, forming a fluorocarbon layer on the first dielectric layer, forming a second dielectric layer on the fluorocarbon layer, and performing an etch process on the second dielectric layer using the fluorocarbon layer as an etch stop mask to form an opening. The interconnect structure thus formed has an improved uniformity and reduced parasitic capacitance.

15 Claims, 5 Drawing Sheets

(51) Int. Cl.
*H01L 23/522* (2006.01)
*H01L 23/528* (2006.01)
*H01L 23/532* (2006.01)
*H01L 21/02* (2006.01)

(52) U.S. Cl.
CPC .. *H01L 21/31144* (2013.01); *H01L 21/76802* (2013.01); *H01L 21/76811* (2013.01); *H01L 21/76829* (2013.01); *H01L 21/76877* (2013.01); *H01L 23/528* (2013.01); *H01L 23/5226* (2013.01); *H01L 23/53209* (2013.01); *H01L 23/53295* (2013.01); *H01L 21/0212* (2013.01); *H01L 21/0234* (2013.01); *H01L 21/02115* (2013.01); *H01L 21/02323* (2013.01)

(58) Field of Classification Search
CPC ......... H01L 21/76811; H01L 21/76829; H01L 21/76877
See application file for complete search history.

(56) References Cited

U.S. PATENT DOCUMENTS

| | | |
|---|---|---|
| 2002/0054962 A1 | 5/2002 | Huang |
| 2003/0129840 A1* | 7/2003 | Kumar ............... H01L 21/3065 438/694 |
| 2003/0190829 A1 | 10/2003 | Brennan |
| 2004/0191932 A1* | 9/2004 | Fuse ................. H01J 37/32935 438/9 |
| 2009/0230558 A1 | 9/2009 | Matsuoka |
| 2010/0022091 A1* | 1/2010 | Li ....................... H01J 37/3244 438/706 |
| 2014/0054754 A1* | 2/2014 | Watanabe ......... H01L 21/76814 257/635 |
| 2015/0262912 A1 | 9/2015 | Ting |

OTHER PUBLICATIONS

Garozzo et al., Fluorocarbon Chemistry: A 0-Dimensional Model for Oxide and Nitride Dry Etching, IEEE Transactions on Semiconductor Manufacturing, vol. 28, No. 3, Aug. 2015, pp. 337-344.
Yejun et al., Study on the Hydrophobic Fluorinated Amorphous Carbon (a-C:F) Film Deposited by DBD-PECVD, Journal of Dalian Nationalities University, vol. 11, No. 1, Jan. 2009, pp. 45-50.
European Patent Application No. 17192406.1, Extended European Search Report dated Feb. 14, 2018, 7 pages.

* cited by examiner

METHOD FOR FLUOROCARBON FILM USED AS MIDDLE STOP LAYER FOR POROUS LOW K FILM

CROSS-REFERENCES TO RELATED APPLICATIONS

This application claims priority to Chinese patent application No. 201610868147.1, filed Sep. 30, 2016, the content of which is incorporated herein by reference in its entirety.

FIELD OF THE INVENTION

Embodiments of the present disclosure relate to the field of semiconductor technology. In particular, embodiments of the present disclosure relate to an interconnect structure and method for manufacturing the same.

BACKGROUND OF THE INVENTION

With the development of integrated circuit technology, semiconductor device elements and structures have become increasingly smaller in size. In order to reduce the parasitic capacitance between the metal interconnects, low-k dielectric materials are gradually used instead of silicon dioxide in the interconnect structure. A porous ultra-low k material can further reduce the dielectric constant of the dielectric material in the interconnect structure. Therefore, porous ultra-low k materials are generally used in interconnect structures in small-sized semiconductor devices.

An opening needs to be formed by etching the porous ultra-low k material prior to forming the metal interconnect. The uniformity of the opening affects the uniformity of the metal interconnect.

BRIEF SUMMARY OF THE INVENTION

The present inventor has discovered that the uniformity of the metal interconnects is relatively poor when a porous ultra-low k material is utilized as a dielectric material in an interconnect structure, and the poor uniformity of the metal interconnects increases the parasitic capacitance between the metal interconnects. The present inventor provides a novel interconnect structure and method for manufacturing the same to improve the uniformity of the interconnects for solving the above-described problems.

Embodiments of the present disclosure provide a method for manufacturing an interconnect structure including providing a metal interconnect layer; forming a first dielectric layer on the metal interconnect layer; forming a fluorocarbon layer on the first dielectric layer; forming a second dielectric layer on the fluorocarbon layer; and performing an etch process on the second dielectric layer using the fluorocarbon layer as an etch stop mask to form an opening.

In an embodiment, performing the etch process includes forming a patterned hardmask layer on the second dielectric layer, the hardmask layer having a first opening extending into the hardmask layer; forming a patterned first mask layer on the hardmask layer, the first mask layer having a second opening extending to a bottom of the first opening; etching the hardmask layer and the second dielectric layer using the first mask layer as a mask to expose a portion of the fluorocarbon layer; and removing the first mask layer to form the opening.

In an embodiment, the method further includes removing the exposed portion of the fluorocarbon layer and a portion of the first dielectric layer under the exposed portion of the fluorocarbon layer using the etched hardmask layer as a mask to form a through hole extending to the metal interconnect layer; removing a portion of the hardmask layer and a portion of the first dielectric layer below the first opening to form a trench extending to the fluorocarbon layer.

In an embodiment, the second opening of the first mask layer includes two openings extending to the bottom of the first opening to form two corresponding through holes extending to the metal interconnect layer.

In an embodiment, the method further includes forming a metal layer filling the trench and the through hole.

In an embodiment, forming the patterned hardmask layer on the second dielectric layer includes forming a first hardmask layer on the second dielectric layer, a second hardmask layer on the first hardmask layer, and a third hardmask layer on the second hardmask layer; forming a patterned second mask layer on the third hardmask layer; etching the third hardmask layer and the second hardmask layer using the second mask layer as a mask to form the opening extending into the second hardmask layer or extending into a surface off the first hardmask layer; and removing the second mask layer.

In an embodiment, forming the patterned second mask layer on the third hardmask layer includes forming a mask oxide layer on the third hardmask layer; forming the second mask layer on the mask oxide layer; etching the third hardmask layer and the second hardmask layer includes etching the mask oxide layer, the third hardmask layer, and the second hardmask layer using the second mask layer as a mask. After removing the second mask layer, the method further includes removing a remaining portion of the mask oxide layer.

In an embodiment, the first hardmask layer includes non-porous SiOCH; the second hardmask layer includes tetraethyl orthosilicate (TEOS); and the third hardmask layer comprises titanium nitride (TiN).

In an embodiment, the method further includes, after forming the fluorocarbon layer on the first dielectric layer, subjecting the fluorocarbon layer to an oxygen-containing plasma treatment. In an embodiment, the oxygen-containing plasma treatment includes a source gas including $O_2$, $O_3$, or $H_2O$.

In an embodiment, each of the first and second dielectric layers includes a porous low-k dielectric layer.

In an embodiment, the fluorocarbon layer is a hydrogen-containing fluorocarbon layer.

In an embodiment, etching a portion of the fluorocarbon layer and a portion of the first dielectric layer below the opening using a remaining portion of the hardmask layer as a mask includes etching the portion of the fluorocarbon layer below the opening comprises a source gas including an $O_2$ containing first plasma; and etching the portion of the first dielectric layer below the opening comprises a source gas of a $CF_4$ containing second plasma.

In an embodiment, the source gas of the second plasma further includes $CO$ or $CO_2$.

Embodiments of the present disclosure also provide an interconnect structure including a metal interconnect layer, a first dielectric layer on the metal interconnect layer, a fluorocarbon layer on the first dielectric layer, a second dielectric layer on the fluorocarbon layer, a trench extending through the second dielectric layer to the fluorocarbon layer, and a through hole in the trench extending to the metal interconnect layer.

In an embodiment, the through hole includes a first through hole and a second through hole.

In an embodiment, the interconnect structure further includes a metal layer filling the trench and the through hole.

In an embodiment, each of the first and second dielectric layers includes a porous low-k dielectric layer. In an embodiment, the fluorocarbon layer is a hydrogen-containing fluorocarbon layer.

In an embodiment, the interconnect structure further includes a first hardmask layer comprising SiOCH on the second dielectric layer, a second hardmask layer comprising TEOS on the first hardmask layer, and a third hardmask layer comprising TiN on the second hardmask layer.

The following description, together with the accompanying drawings, will provide a better understanding of the nature and advantages of the claimed invention.

BRIEF DESCRIPTION OF THE DRAWINGS

The accompanying drawings, referred to herein and constituting a part hereof, illustrate embodiments of the invention. The drawings together with the description serve to explain the principles of the invention.

DETAILED DESCRIPTION OF THE INVENTION

Figure 1:
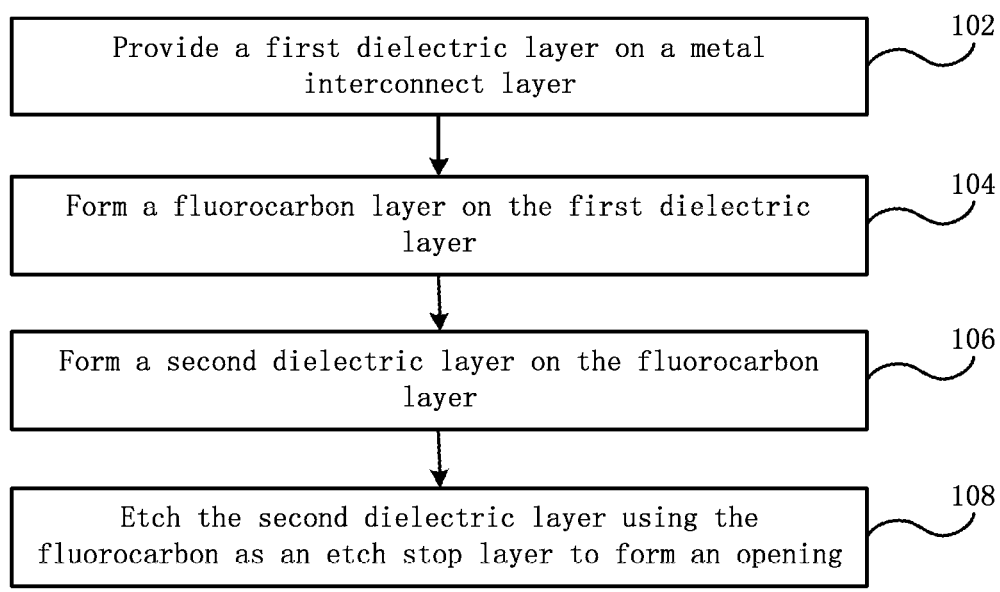
FIG. 1 is a flowchart illustrating a manufacturing method of an interconnect structure according to embodiments of the present disclosure.

In the following description, numerous specific details are provided for a thorough understanding of the present disclosure. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to perspective cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present, In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The use of the terms first, second, third, etc. do not denote any order, but rather the terms first, second, third, etc. are used to distinguish one element from another. Furthermore, the use of the terms a, an, etc. does not denote a limitation of quantity, but rather denote the presence of at least one of the referenced items.

The term "substrate" may include any structure having an exposed surface with which to form an integrated circuit. The term "substrate" is understood to include semiconductor wafers and is also used to refer to semiconductor structures during, processing and may include other layers that have been fabricated thereupon. A "substrate" may include doped and undoped semiconductor wafers, epitaxial semiconductor layers, as well as other semiconductor structures.

Notice that similar reference numerals and letters refer to similar items in the following figures, and thus once an item is defined in a figure, it may not be discussed or further defined in following figures.

The present inventor proposes the use of fluorocarbons to form an interconnect structure. Fluorocarbons have good thermal stability and can withstand thermal shocks in the integrated circuit manufacturing process and the increased temperature during the device operation. Further, fluorocarbons have good adhesion and filling properties and are compatible with the manufacturing process of integrated circuits.

In accordance with some embodiments of the present disclosure, FIG. 1 is a flowchart illustrating a method for manufacturing an interconnect structure. In the disclosure, each drawing or step in the flowchart represents a process associated with embodiments of the method described. Those of skill in the art will recognize that additional steps and drawings that described the embodiments may be added.

Referring to FIG. 1, the method may include the following steps:

Step 102, providing a first dielectric layer on a metal interconnect layer. The metal interconnect layer may be, for example, a copper (Cu) interconnect layer. Preferably, the first dielectric layer is a porous low-k dielectric layer, such as SiCOH.

Step 104: forming (e.g., using a deposition process) a fluorocarbon layer on the first dielectric layer. For example, the fluorocarbon layer may be formed using a plasma enhanced chemical vapor deposition (PECVD) or a physical vapor deposition (PVD) process. The fluorocarbon layer may be, for example, in the form of $C_xF_y$, and the x and y may vary according to different process conditions. In one embodiment, the fluorocarbon layer may be a hydrogen-containing fluorocarbon layer.

Step 106: forming (e.g., using a deposition process) a second dielectric layer on the fluorocarbon layer. Preferably, the second dielectric layer is a porous low-k dielectric layer, such as SiCOH.

Step 108: etching the second dielectric layer using the fluorocarbon layer as an etch stop layer to form an opening extending to the fluorocarbon layer.

The fluorocarbon layer has a higher etch selectivity ratio in relation to a general dielectric layer, especially to a porous low-k dielectric layer, so that the etch process performed on the second dielectric layer can be easily stopped at the fluorocarbon layer, thereby obtaining an improved uniformity of the opening.

The present disclosure provides a method of manufacturing an interconnect structure using a fluorocarbon layer as an etch stop layer to form an opening. The thus formed opening has an improved uniformity, so that a metal interconnect subsequently formed in the opening also has an improved uniformity that reduces the parasitic capacitance between the metal interconnects.

FIGS. 2 through 10 are cross-sectional views illustrating intermediate stages of a manufacturing method of an interconnect structure according to some embodiments of the present disclosure. The manufacturing method of an interconnect structure according to some embodiments of the present disclosure will be described in detail with reference to FIGS. 2 to 10.

Figure 2:
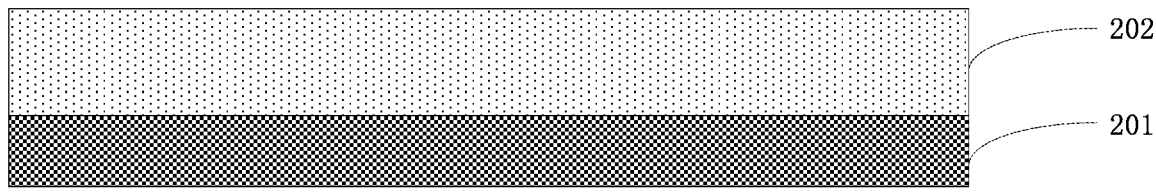
FIGS. 2 through 10 are cross-sectional views illustrating intermediate stages of a manufacturing method of an interconnect structure according to some embodiments of the present disclosure.

Referring to FIG. 2, a metal interconnect layer 201 is provided, and a first dielectric layer 202 is formed on metal interconnect layer 201. In one embodiment, first dielectric layer 202 may be a porous low-k dielectric layer or an ultra-low k dielectric layer. In another embodiment, first dielectric layer 202 may include a SiCN layer on metal interconnect layer 201, a buffer layer (e.g. a silicon oxide layer) on the SiCN layer, and a porous low-k dielectric layer or an ultra-low k dielectric layer on the buffer layer. Herein, the porous low-k dielectric layer or ultra-low k dielectric layer may be, for example, SiOCH or the like.

Figure 3:
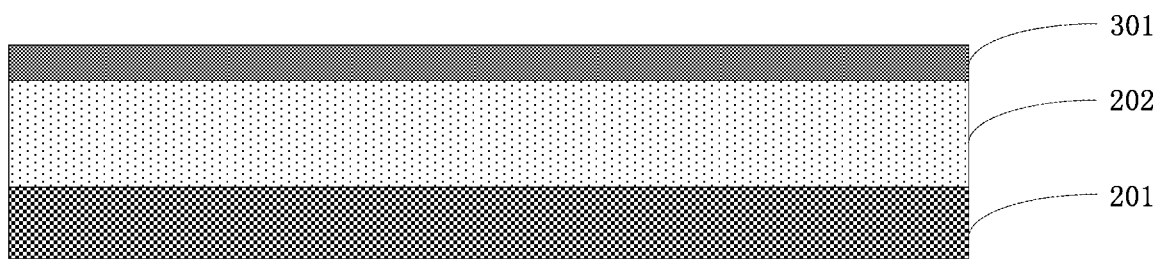

Thereafter, a fluorocarbon layer 301 is formed (e.g., using a deposition process) on first dielectric layer 202, as shown in FIG. 3. For example, the fluorocarbon layer may be deposited using a PECVD or PVD process using an organic gas (e.g., $C_xF_y$, and $CH_4$) containing carbon, fluorine and hydrogen as a source gas. In one embodiment, fluorocarbon layer 301 may be a hydrogen-containing fluorocarbon layer. In one embodiment, fluorocarbon layer 301 may be a doped fluorocarbon layer, e.g., a fluorocarbon layer may be doped with nitrogen or boron. In a preferred embodiment, fluorocarbon layer 301 has a thickness in the range between 5 angstroms and 1000 angstroms, e.g., 50 angstroms, 100 angstroms, 400, angstroms, 600 angstroms, etc.

In a preferred embodiment, after depositing fluorocarbon layer 301 on first dielectric layer 202, the deposited fluorocarbon layer may be subjected to an oxygen-containing plasma treatment. Herein, the source gas of the oxygen-containing plasma may include, for example, $O_2$, $O_3$, or $H_2O$. The surface portion of fluorocarbon layer 301 can be oxidized by subjecting the fluorocarbon layer to an oxygen-containing plasma treatment to increase the bonding force between fluorocarbon layer 301 and a subsequently deposited second dielectric layer 401.

Figure 4:
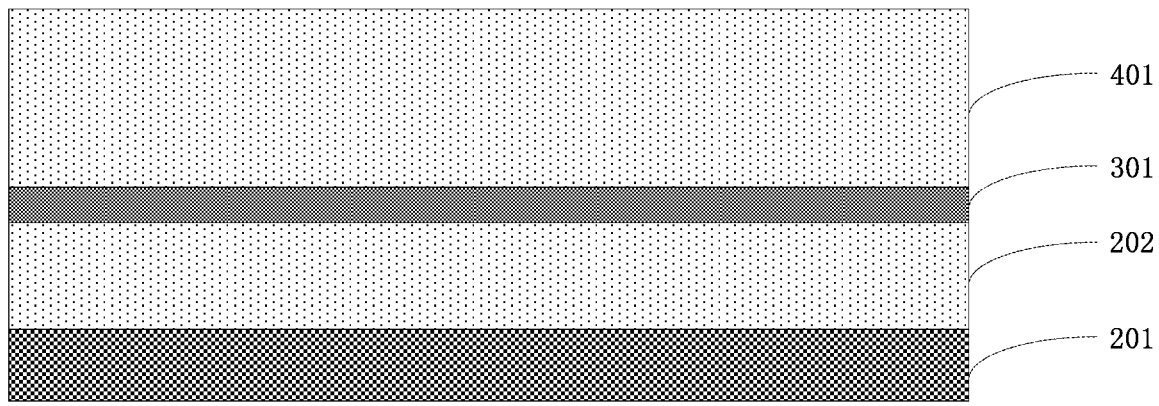

Next, a second dielectric layer 401 is formed on fluorocarbon layer 301, as shown in FIG. 4. In one embodiment, second dielectric layer 401 may be a porous low-k dielectric layer or an ultra-low k dielectric layer.

Thereafter, an etch process is performed on second dielectric layer 401 using fluorocarbon layer 301 as an etch stop layer to form an opening extending to the surface of fluorocarbon layer 301.

It is noted that, as employed herein, the term "opening," "via", or "trench" refers to an opening, a via, or a trench extending to a layer.

Figure 5:
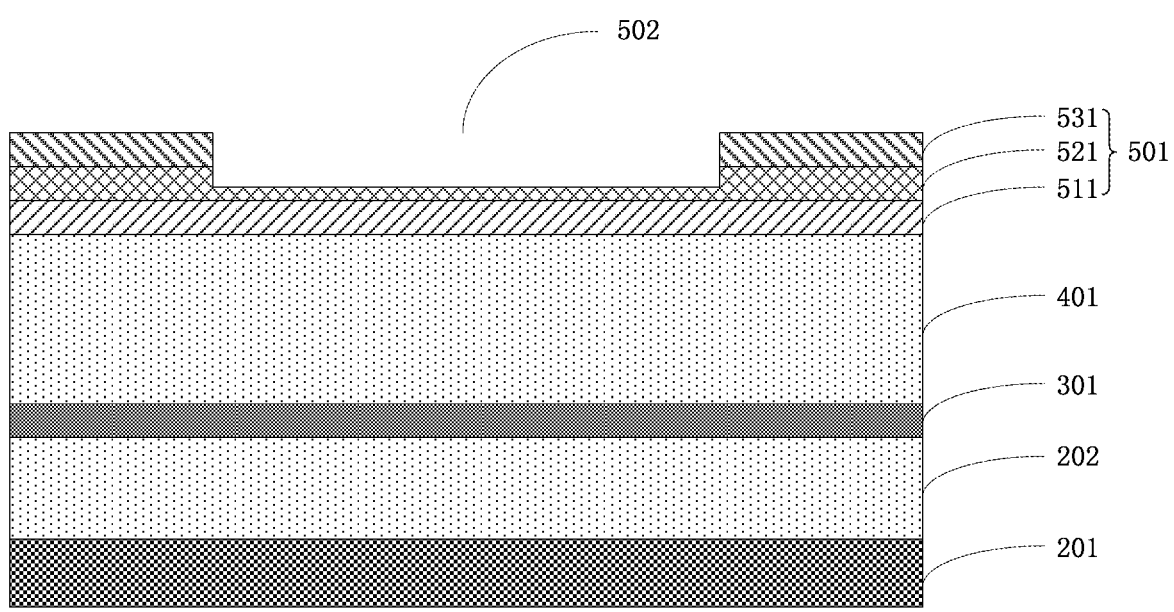
Figure 6:
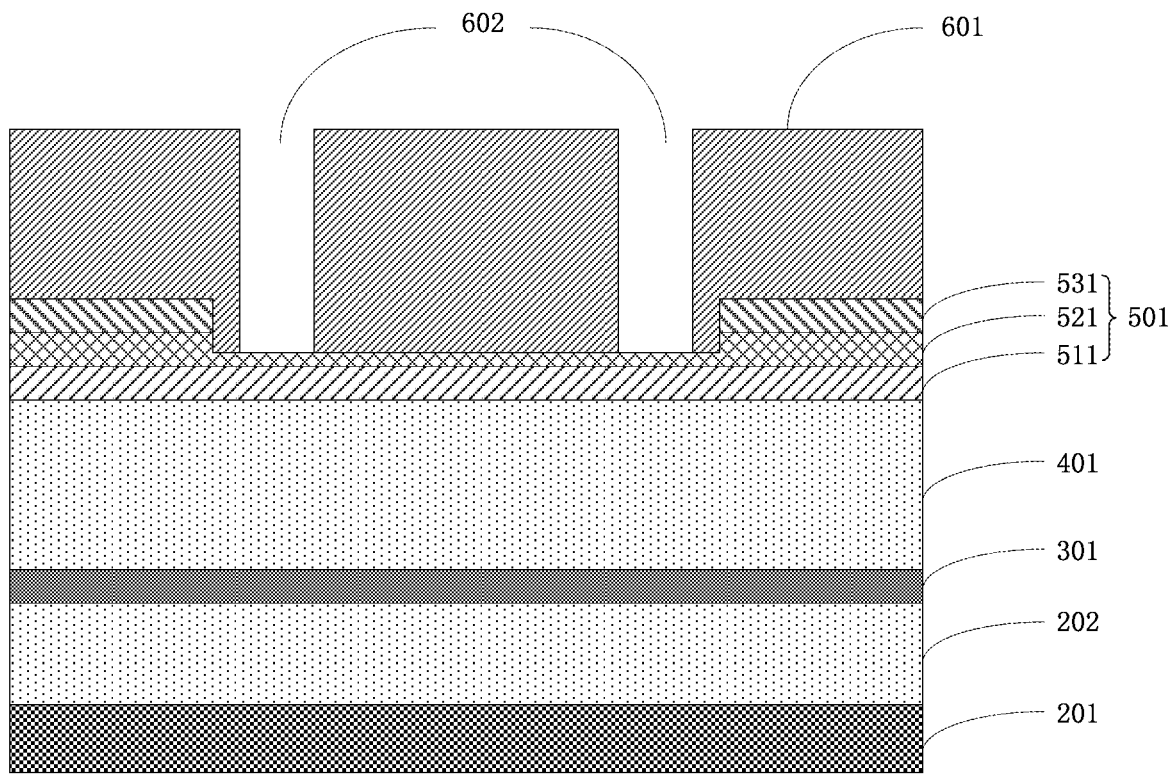
Figure 7:
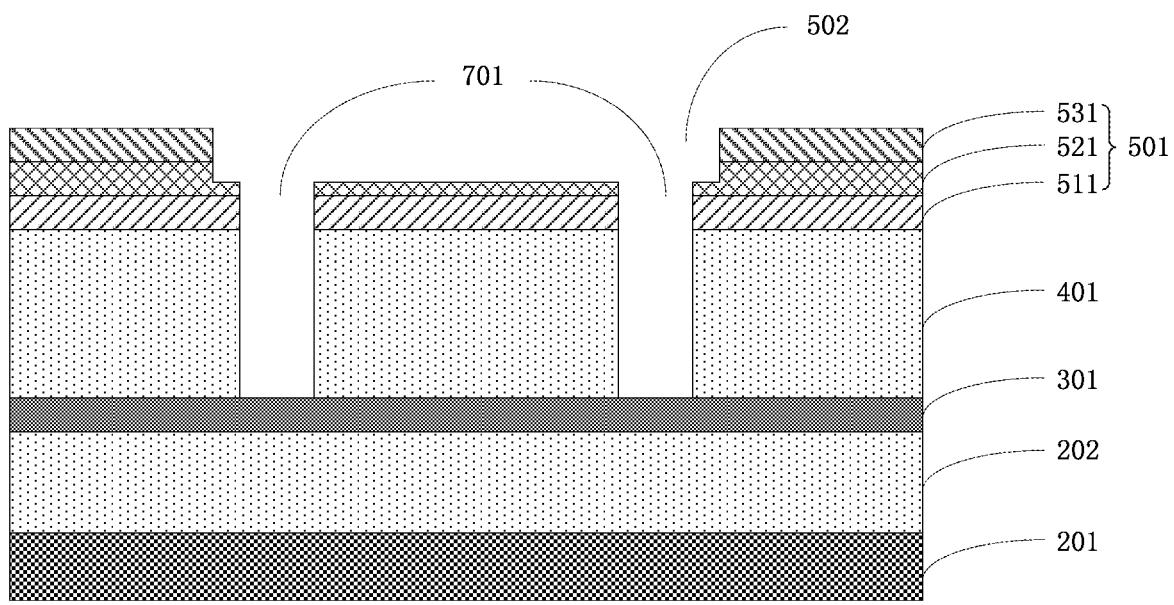

In one embodiment, an opening extending to fluorocarbon layer 301 may be formed by the steps shown in FIGS. 5 to 7.

Referring to FIG. 5, a patterned hardmask layer 501 is formed on second dielectric layer 401. Hardmask layer 501 has a first opening 502 extending into hardmask layer 501.

In some embodiments, a first hardmask layer 511, a second hardmask layer 521, and a third hardmask layer 531 may be sequentially formed on second dielectric layer 401. For example, first hardmask layer 511 may include non-porous SiOCH; second hardmask layer 521 may include tetraethyl orthosilicate (TEOS), third hardmask layer 531 may include titanium nitride (TiN). However, it is to be understood that the invention is not limited thereto. A patterned mask layer (e.g., a photoresist) is then formed over third hardmask layer 531. In order to distinguish the patterned mask layer (not shown) from a first mask layer disclosed later, the patterned mask layer herein may be referred to as a second mask layer. An etch process is performed on third hardmask layer 531 and second hardmask layer 521 using the second mask layer as a mask to form an opening 502 extending into second hardmask layer 521 (as shown in FIG. 5) or extending to the surface of first hardmask layer 511. Preferably, first opening 502 may extend below the middle portion of second hardmask layer 521, that is, more than half of the thickness of second hardmask layer 521 may be removed, as shown in FIG. 5. Thereafter, the second mask layer is removed. That is, first opening 502 in hardmask layer 501 includes a remaining portion of second hardmask layer 521 (less than half of the thickness of second hardmask layer 521).

In some other embodiments, after first hardmask layer 511, second hardmask layer 521, and third hardmask layer 531 are sequentially formed, a mask oxide layer (e.g., silicon oxide) may be formed (not shown) on third hardmask layer 531. The second mask layer is then formed on the mask oxide layer. Thereafter, the mask oxide layer, third hardmask layer 531, and second hardmask layer 521 are successively etched using the second mask layer as a mask to form the first opening. After removing the second mask layer, the remaining mask oxide layer is also removed.

Referring to FIG. 6, a patterned mask layer 601 (also referred to as a first mask layer), e.g., a photoresist, is formed on hard mask layer 501. First mask layer 601 has an second opening 602 extending to the bottom of first opening 502. In one embodiment, second opening 602 may include two openings (as shown in FIG. 6), so that two through holes (vias) can be formed subsequently that extend to metal interconnect layer 201. In another embodiment, first mask layer 601 may have second opening 602 extending to the bottom of first opening 501, so that a through hole (via) may be subsequently formed extending to metal interconnect layer 201.

Referring to FIG. 7, an etch process is performed on hardmask layer 501 and second dielectric layer 401 using first mask layer 601 as a mask. First mask layer 601 is then removed to form an opening 701 extending to fluorocarbon layer 301 and exposing a portion of the surface of fluorocarbon layer 301.

Figure 8:
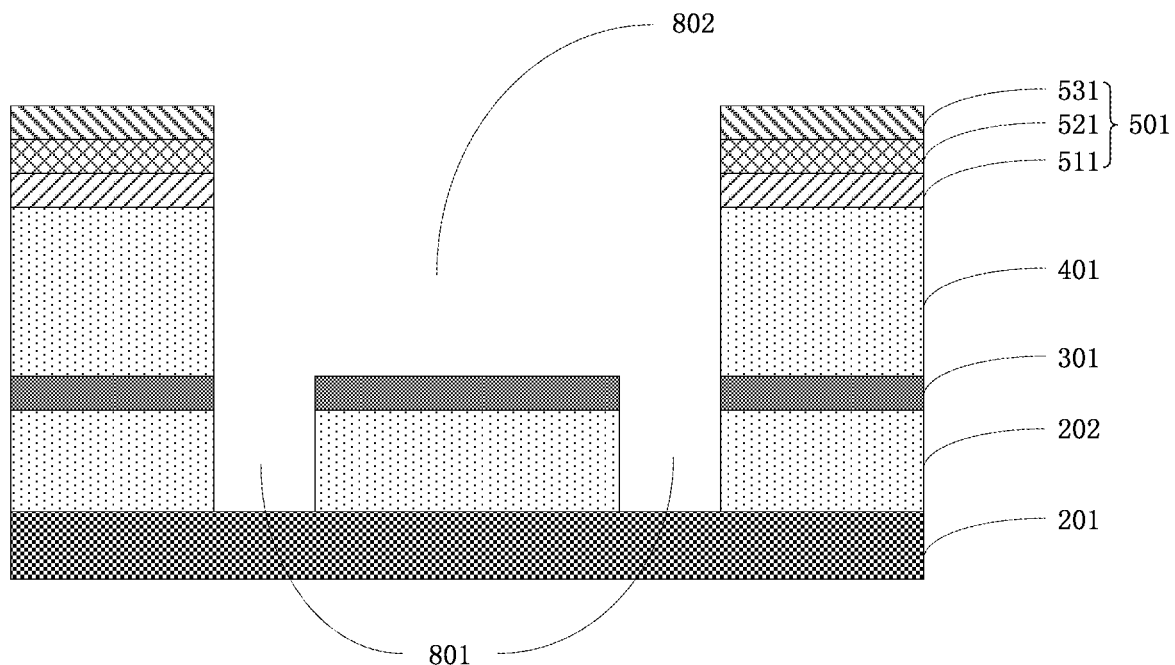

The exposed portion of fluorocarbon layer 301 and a portion of first dielectric layer 202 under opening 701 may also be removed using hardmask layer 501 as a mask to form an opening 801. A portion of the hardmask layer 501 in first opening 502 (i.e., the portion of the remaining hardmask layer 521, the portion of first hardmask layer 511 below the remaining layer 521 in the first opening), and a portion of second dielectric layer 401 in first opening 502 are also removed to form a trench 802 extending to the surface of fluorocarbon layer 301, as shown in FIG. 8.

In one embodiment, the exposed portion of fluorocarbon layer 301 in opening 701 may be removed using a source gas of a first oxygen-containing plasma. In one embodiment, the portion of first dielectric layer 202 under opening 701 may be etched using a source gas of a second $CF_4$-containing plasma. In one embodiment, the source gas of the second plasma may also include CO or $CO_2$. In addition, in the etching of the exposed portion of fluorocarbon layer 301 and the portion of first dielectric layer 202 below opening 701, nitrogen gas, argon gas, helium gas, or a combination thereof may be used as a carrier gas.

It is to be understood that the number of through holes extending to the metal interconnect layer can be any integer number N. In the example shown in FIG. 8, two through holes 801 are shown extending from fluorocarbon layer 301 to metal interconnect layer 201. But it is understood that the number is arbitrary chosen for describing the example embodiment and should not be limiting. In some other embodiments, as described above, the number of through hole 801 may be one through hole.

Fluorocarbon layer 301 enables trench 802 in the different portions of the interconnect structure to have contact to the surface of the fluorocarbon layer, so that through hole 801 in the different portions of the interconnect structure has contact to the surface of the fluorocarbon layer, thereby improving the uniformity of trench 802 and through hole 801 in the vertical direction (direction perpendicular to the surface of the metal interconnect layer). Metal interconnect lines that are formed by subsequently filling a metal layer in the trench and through hole(s) also have improved uniformity, which can reduce the parasitic capacitance between the metal interconnect lines.

Figure 9:
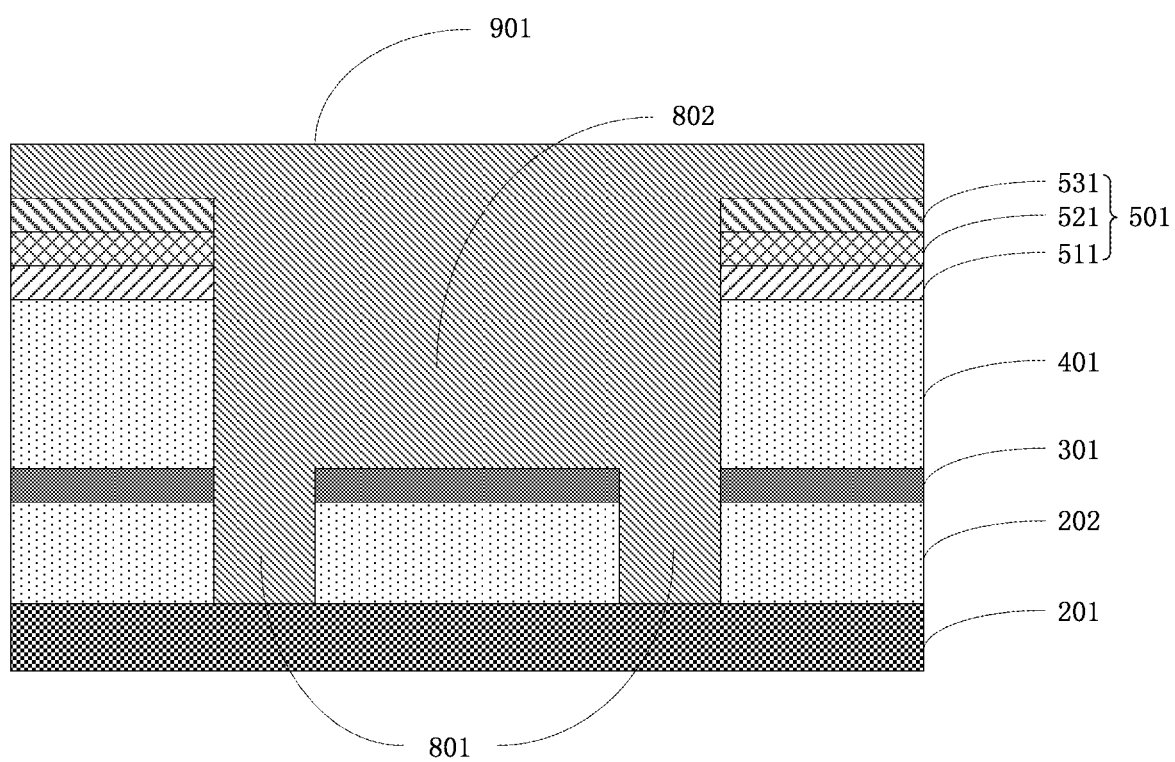

Thereafter, a metal layer 901 may be formed to fill trench 802 and through hole 801, as shown in FIG. 9. Metal layer 901 may also be formed on remaining hardmask layer 501. In one embodiment, metal layer 901 may include copper.

Figure 10:
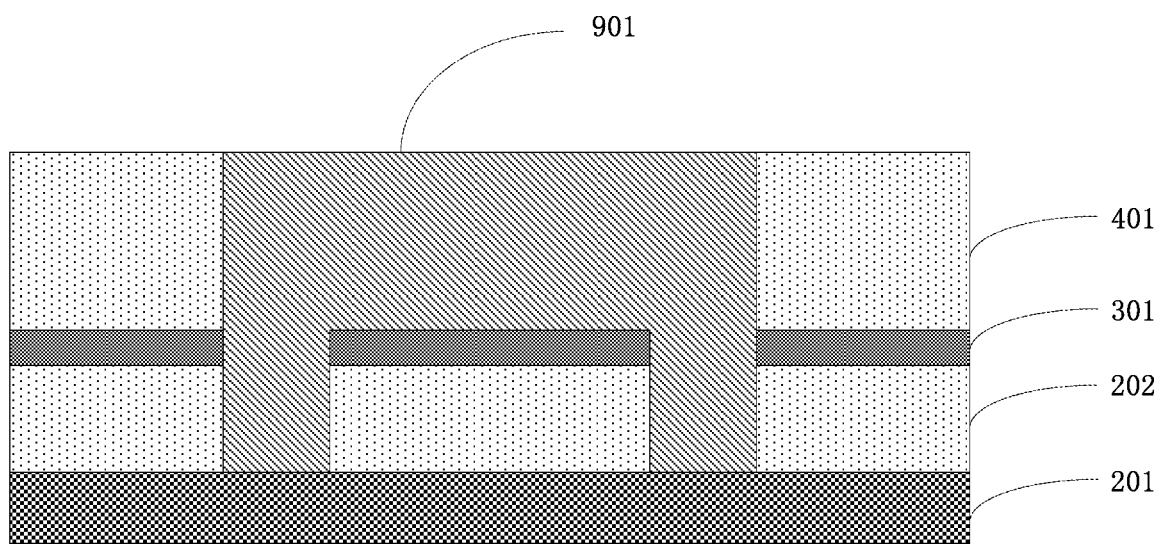

Thereafter, a planarization (e.g., a chemical mechanical polishing) process is performed on metal layer 901 to form a metal interconnect line, as shown in FIG. 10. In one embodiment, the planarized metal layer 901 has a planar surface that is flush with the upper surface of second dielectric layer 401.

Thus, a method for manufacturing an interconnect structure has been described above according to some embodiment of the present disclosure with reference to FIGS. 2 through 10. One of skill in the art will appreciate that steps shown in FIGS. 2 to 10 may be performed in different embodiments, and that some processes in FIGS. 2 to 10 are not necessary in one embodiment.

Embodiments of the present disclosure also provide a novel interconnect structure. Referring to FIG. 8, the interconnect structure may include a metal interconnect layer 201, a first dielectric layer 202 on metal interconnect layer 201, a fluorocarbon layer 301 on first dielectric layer 202, and a second dielectric layer 401 on fluorocarbon layer 301. Second dielectric layer 401 includes a trench 802 extending to the surface of fluorocarbon layer 301. The interconnect structure may also include a through hole 801 in trench 802 extending through fluorocarbon layer 301 and first dielectric layer 202 to the surface of metal interconnect layer 201. In one embodiment, the interconnect structure may have two through holes 801 in the trench that extend through the fluorocarbon layer and the first dielectric layer to the surface of metal interconnect layer.

In one embodiment, referring still to FIG. 8, the interconnect structure may further include a first hardmask layer 511 on second dielectric layer 401, a second hardmask layer 521 on first hardmask layer 511, and a third hardmask layer 531 on second hardmask layer 521. In one exemplary embodiment, first hardmask layer 511 may include non-porous SiOCH; second hardmask layer 521 may include tetraethyl orthosilicate (TEOS), third hardmask layer 531 may include titanium nitride (TiN).

In one embodiment, referring to FIG. 10, the interconnect structure may further include a metal layer 901 filling trench 802 and through hole 801. Metal layer 901 may include copper.

Preferred embodiments of the present disclosure have been described in detail hereinabove. It is to be understood that the scope of the invention also comprehends embodiments from those described, yet within the scope of the claims.

While the present disclosure is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description.

Furthermore, some of the features of the preferred embodiments of the present disclosure could be used to advantage without the corresponding use of other features. As such, the foregoing description should be considered as merely illustrative of the principles of the invention, and not in limitation thereof.

What is claimed is:

1. A method for manufacturing an interconnect structure, the method comprising:
   providing a metal interconnect layer;
   forming a first dielectric layer on the metal interconnect layer;
   forming a fluorocarbon layer on the first dielectric layer;
   forming a second dielectric layer on the fluorocarbon layer;
   forming a patterned hardmask layer comprising a first hardmask layer on the second dielectric layer, a second hardmask layer on the first hardmask layer, and a third hardmask layer on the second hardmask layer and a first opening extending through the third hardmask layer and into the second hardmask layer but not completely passing through the second hardmask layer; and
   performing an etch process on the second dielectric layer using the patterned hardmask layer as a mask and the fluorocarbon layer as an etch stop mask to form an opening.

2. The method of claim 1, wherein performing the etch process comprises:
   forming a patterned first mask layer on the patterned hardmask layer, the patterned first mask layer having a second opening extending to a bottom of the first opening;
   etching a portion of the patterned hardmask layer and a portion of the second dielectric layer using the patterned first mask layer as a mask to expose a portion of the fluorocarbon layer; and
   removing the first mask layer to form the opening.

3. The method of claim 2, further comprising:
   removing the exposed portion of the fluorocarbon layer and a portion of the first dielectric layer under the exposed portion of the fluorocarbon layer using a remaining portion of the hardmask layer as a mask to form a through hole extending to the metal interconnect layer;

removing a portion of the remaining portion of the hardmask layer and a portion of the second dielectric layer below the first opening to form a trench extending to the fluorocarbon layer.

4. The method of claim 3, wherein the second opening of the first mask layer comprises two openings extending to the bottom of the first opening to form two corresponding through holes extending to the metal interconnect layer.

5. The method of claim 3, further comprising:
forming a metal layer filling the trench and the through hole.

6. The method of claim 1, wherein forming the patterned hardmask layer on the second dielectric layer comprises:
forming a patterned second mask layer on the third hardmask layer;
etching the third hardmask layer and the second hardmask layer using the patterned second mask layer as a mask to form the opening extending into a surface of the first hardmask layer; and
removing the patterned second mask layer.

7. The method of claim 6, wherein forming the patterned second mask layer on the third hardmask layer comprises:
forming a mask oxide layer on the third hardmask layer;
forming the second mask layer on the mask oxide layer;
etching the third hardmask layer and the second hardmask layer comprises:
etching the mask oxide layer, the third hardmask layer, and the second hardmask layer using the second mask layer as a mask; and after removing the second mask layer, the method further comprising:
removing a remaining portion of the mask oxide layer.

8. The method of claim 1, wherein:
the first hardmask layer comprises non-porous SiOCH;
the second hardmask layer comprises tetraethyl orthosilicate (TEOS); and
the third hardmask layer comprises titanium nitride (TiN).

9. The method of claim 1, further comprising, after forming the fluorocarbon layer on the first dielectric layer:
subjecting the fluorocarbon layer to an oxygen-containing plasma treatment.

10. The method of claim 9, wherein the oxygen-containing plasma treatment comprises a source gas including $O_2$, $O_3$, or $H_2O$.

11. The method of claim 1, wherein the first and second dielectric layers each comprise a porous low-k dielectric layer.

12. The method of claim 1, wherein the fluorocarbon layer is a hydrogen-containing fluorocarbon layer.

13. The method of claim 2, further comprising, using a remaining portion of the hardmask layer as a mask:
etching the exposed portion of the fluorocarbon layer using a source of a first oxygen-containing plasma; and
etching a portion of the first dielectric layer below the opening using a source gas of a second $CF_4$ containing plasma.

14. The method of claim 13, wherein the source gas of the second $CF_4$ containing plasma further comprises CO or $CO_2$.

15. The method of claim 1, wherein the first opening extends at a distance more than one-half a thickness of the second hardmask layer.

* * * * *